(12) United States Patent
Hattori et al.

(10) Patent No.: US 9,338,889 B2
(45) Date of Patent: May 10, 2016

(54) METHOD OF MANUFACTURING MOUNTING SUBSTRATE ON WHICH MONOLITHIC CERAMIC CAPACITORS ARE MOUNTED AND MOUNTING STRUCTURE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Norio Shiroiwa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 279 days.

(21) Appl. No.: 14/050,842

(22) Filed: Oct. 10, 2013

(65) Prior Publication Data

US 2014/0110161 A1 Apr. 24, 2014

(30) Foreign Application Priority Data

Oct. 19, 2012 (JP) .................................. 2012-231700
Jun. 27, 2013 (JP) .................................. 2013-134914

(51) Int. Cl.
| | | |
|---|---|---|
| *H05K 1/18* | (2006.01) | |
| *H05K 3/30* | (2006.01) | |
| *H01G 4/30* | (2006.01) | |
| *H05K 1/11* | (2006.01) | |

(Continued)

(52) U.S. Cl.
CPC .............. *H05K 1/181* (2013.01); *H01G 2/065* (2013.01); *H01G 4/30* (2013.01); *H05K 1/111* (2013.01); *H05K 3/303* (2013.01); *H05K 3/3415* (2013.01); *H05K 3/3442* (2013.01); *H01G 4/232* (2013.01); *H05K 2201/10015* (2013.01); *H05K 2201/10545* (2013.01); *H05K 2201/2045* (2013.01); *Y02P 70/611* (2015.11); *Y02P 70/613* (2015.11); *Y10T 29/4913* (2015.01)

(58) Field of Classification Search
CPC ....................................................... H05K 1/181
See application file for complete search history.

(56) References Cited

U.S. PATENT DOCUMENTS 6,304,425 B1 10/2001 Mamada

FOREIGN PATENT DOCUMENTS

| JP | 8-55752 A | 2/1996 |
|---|---|---|
| JP | 2000-232030 A | 8/2000 |

(Continued)

OTHER PUBLICATIONS

Machine Translation of JP 2000-232030, Aug. 22, 2000.*

(Continued)

*Primary Examiner* — Jeremy C Norris
(74) *Attorney, Agent, or Firm* — Keating & Bennett, LLP

(57) ABSTRACT

A method of manufacturing a mounting substrate in which a pair of monolithic ceramic capacitors each of which includes a multilayer body in which a plurality of dielectric ceramic sheets and a plurality of substantially planar inner electrodes are stacked on top of one another and at least a pair of outer electrodes electrically connected to the inner electrodes and provided on a surface of the multilayer body are mounted on a circuit board includes a process of joining the outer electrodes to lands formed on the front rear surfaces of the circuit board, the lands formed on the front surface being formed at positions that are plane-symmetrical to positions of the corresponding lands formed on the rear surface while being electrically connected to the corresponding lands formed on the rear surface, such that surface directions of planes of the inner electrodes match each other.

17 Claims, 6 Drawing Sheets

(51) Int. Cl.
*H05K 3/34* (2006.01)
*H01G 2/06* (2006.01)
*H01G 4/232* (2006.01)

(56) References Cited

FOREIGN PATENT DOCUMENTS

| JP | 2003-318057 A | 11/2003 |
| JP | 2003-324030 A | 11/2003 |

OTHER PUBLICATIONS

Official Communication issued in corresponding Japanese Patent Application No. 2013-134914, mailed on Jul. 21, 2015.

* cited by examiner

METHOD OF MANUFACTURING MOUNTING SUBSTRATE ON WHICH MONOLITHIC CERAMIC CAPACITORS ARE MOUNTED AND MOUNTING STRUCTURE

BACKGROUND OF THE INVENTION

1. Field of the Invention

The present invention relates to a method of manufacturing a mounting substrate on which monolithic ceramic capacitors are mounted and a mounting structure.

2. Description of the Related Art

Monolithic ceramic capacitors have been widely used in mobile terminals such as cellular phones and audio players and various electronic devices such as personal computers. Such a monolithic ceramic capacitor includes a multilayer body in which a plurality of dielectric ceramic sheets are stacked on top of one another. In the multilayer body, planar inner electrodes are disposed in such a manner as to face each other with at least one of the dielectric ceramic sheets interposed therebetween, and at least a pair of outer electrodes that are electrically connected to the inner electrodes are provided on surfaces of the multilayer body. Outer electrodes of such a monolithic ceramic capacitor are mounted on lands that are formed on a circuit board via a joining material such as solder.

In recent years, electronic devices have been rapidly decreasing in size and rapidly increasing in performance. Accordingly, the capacitance of monolithic ceramic capacitors has been increased. High dielectric constant type ceramics such as barium titanate, calcium titanate, and strontium titanate are used as dielectric ceramic materials of large-capacitance monolithic ceramic capacitors. These high dielectric constant type ceramics, upon application of a voltage (an electric field) thereto, mechanically deform due to piezoelectric and electrostrictive characteristics thereof, such deformation being so-called electric field-induced strain. Therefore, when an alternating-current voltage or a direct-current voltage on which an alternating current component is superimposed is applied to such a monolithic ceramic capacitor, mechanical deformation vibration is generated in a multilayer body of the monolithic ceramic capacitor.

When the vibration due to the electric field-induced strain is transferred to a circuit board, the circuit board vibrates. In the case where the frequency of the vibration sound generated due to the vibration of the circuit board is in the range of 20 Hz to 20,000 Hz, which defines the audio frequency range, the vibration sound is audible to the human ear as an uncomfortable sound (e.g., a screech or an acoustic noise).

Japanese Unexamined Patent Application Publication Nos. 2000-232030 and 2003-318057 describe that the vibration sound of a circuit board may be reduced by arranging monolithic ceramic capacitors at positions on the front and rear surfaces of the circuit board that substantially correspond to each other. Monolithic ceramic capacitors are arranged on the front and rear surfaces of a circuit board, so that the directions of the deformations transferred to the circuit board from these capacitors are opposite to each other, and thus, the vibrations of the circuit board cancel each other out.

However, in the methods of mounting monolithic ceramic capacitors on a circuit board described in Japanese Unexamined Patent Application Publication Nos. 2000-232030 and 2003-318057, there have been problems in that the vibration sound of a circuit board is not always effectively reduced. The vibration of a monolithic ceramic capacitor is to be transferred to a circuit board via a joining material such as solder. The inventors of the present invention have discovered that, in this case, the effect of reducing vibration sound may sometimes not be obtained depending on variation in the formation state of a fillet formed of a joining material.

SUMMARY OF THE INVENTION

Accordingly, preferred embodiments of the present invention provide a method of manufacturing a mounting substrate on which monolithic ceramic capacitors are mounted and a mounting structure capable of effectively reducing the vibration sound of a circuit board due to electric field-induced strains of monolithic ceramic capacitors.

According to a first preferred embodiment of the present invention, there is provided a method of manufacturing a mounting substrate in which a pair of monolithic ceramic capacitors each of which includes a multilayer body in which a plurality of dielectric ceramic sheets and a plurality of substantially planar inner electrodes are stacked on top of one another and at least a pair of outer electrodes that are electrically connected to the inner electrodes and that are provided on a surface of the multilayer body are mounted on a circuit board, the method of manufacturing a mounting substrate including a process of joining the outer electrodes to lands that are formed on a front surface and a rear surface of the circuit board such that surface directions of planes of the inner electrodes match each other, the lands formed on the front surface being formed at positions that are plane-symmetrical to positions of the corresponding lands formed on the rear surface while being electrically connected to the corresponding lands formed on the rear surface.

According to a second preferred embodiment of the present invention, there is provided a mounting structure in which a pair of monolithic ceramic capacitors each of which includes a multilayer body in which a plurality of dielectric ceramic sheets and a plurality of substantially planar inner electrodes are stacked on top of one another and at least a pair of outer electrodes that are electrically connected to the inner electrodes and that are provided on a surface of the multilayer body are mounted on a circuit board. The circuit board includes lands on a front surface and a rear surface of the circuit board, the lands formed on the front surface being formed at positions that are plane-symmetrical to positions of the corresponding lands formed on the rear surface while being electrically connected to the corresponding lands formed on the rear surface, and the outer electrodes of the monolithic ceramic capacitors are joined to the lands, which are formed on the front surface and the rear surface of the circuit board, such that surface directions of planes of the inner electrodes match each other.

In a method of manufacturing a mounting substrate and the mounting structure according to a preferred embodiment of the present invention, the outer electrodes of the monolithic ceramic capacitors are joined to the lands that are formed on the front surface and the rear surface of the circuit board, the lands formed on the front surface being formed at positions that are plane-symmetrical to positions of the corresponding lands formed on the rear surface while being electrically connected to the corresponding lands formed on the rear surface, such that the surface directions of the planes of the inner electrodes match each other, so that the states of vibrations that are to be transmitted from the monolithic ceramic capacitors, which have been joined to the front and rear surfaces of the circuit board, to the circuit board are the same or substantially the same as each other, and thus, the vibrations transmitted to the circuit board cancel each other out. As a result, the vibration of the circuit board is effectively reduced or prevented, and the vibration sound is significantly reduced or prevented.

According to various preferred embodiments of the present invention, the vibration sound of a circuit board due to electric field-induced strains of monolithic ceramic capacitors that are mounted on the circuit board is effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
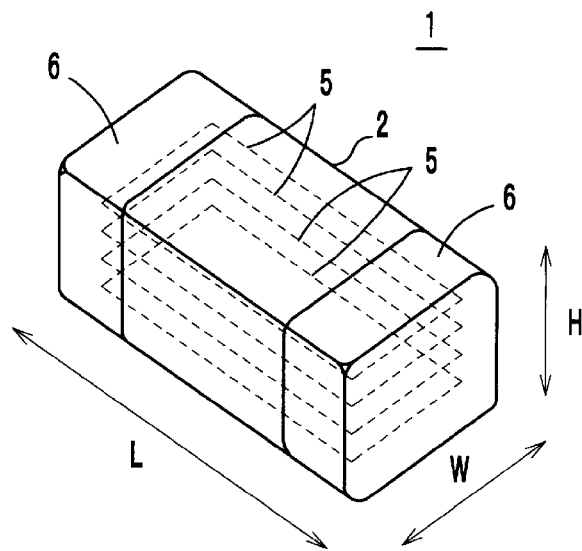
FIGS. 1A and 1B illustrate an example of monolithic ceramic capacitors, and FIG. 1A and FIG. 1B, respectively are a perspective view and a perspective view schematically illustrating an electric field-induced strain.

A method of manufacturing a mounting substrate and a mounting structure according to various preferred embodiments of the present invention will be described below with reference to the accompanying drawings. Note that, the same members and portions in the drawings are denoted by common reference numerals, and repeated descriptions will be omitted.

First Preferred Embodiment

As illustrated in FIG. 1A, monolithic ceramic capacitors 1 that are used in a preferred embodiment of the present invention each include a multilayer body 2 in which a plurality of dielectric ceramic sheets are stacked on top of one another and a pair of outer electrodes 6. Surfaces of the multilayer body 2 include end surfaces that oppose each other, side surfaces that are perpendicular or substantially perpendicular to the end surfaces and that oppose each other, and the top and bottom surfaces that are perpendicular or substantially perpendicular to the end surfaces and to the side surfaces and that oppose each other. In the multilayer body 2, inner electrodes 5 that are planar or substantially planar are arranged to face each other with a dielectric ceramic sheet interposed therebetween. Therefore, when a voltage is applied between the inner electrodes 5, electrostatic capacitance is generated in the dielectric ceramic sheet.

The pair of outer electrodes 6 is arranged so as to extend from the end surfaces to the top and bottom surfaces and to the side surfaces of the multilayer body 2. One of the pair of outer electrodes 6 is electrically connected to one of a pair of the inner electrodes 5 that are adjacent to each other with a dielectric ceramic sheet interposed therebetween. The other one of the pair of outer electrodes 6 is electrically connected to the other one of the pair of the inner electrodes 5, which are adjacent to each other with the dielectric ceramic sheet interposed therebetween. Consequently, a plurality of electrostatic capacitances are connected in parallel with respect to the outer electrodes 6. In each of the monolithic ceramic capacitors 1, the pair of outer electrodes 6 function as input/output electrodes. An outer electrode that functions as a ground electrode may be provided other than the pair of outer electrodes afd6.

Figure 2A:
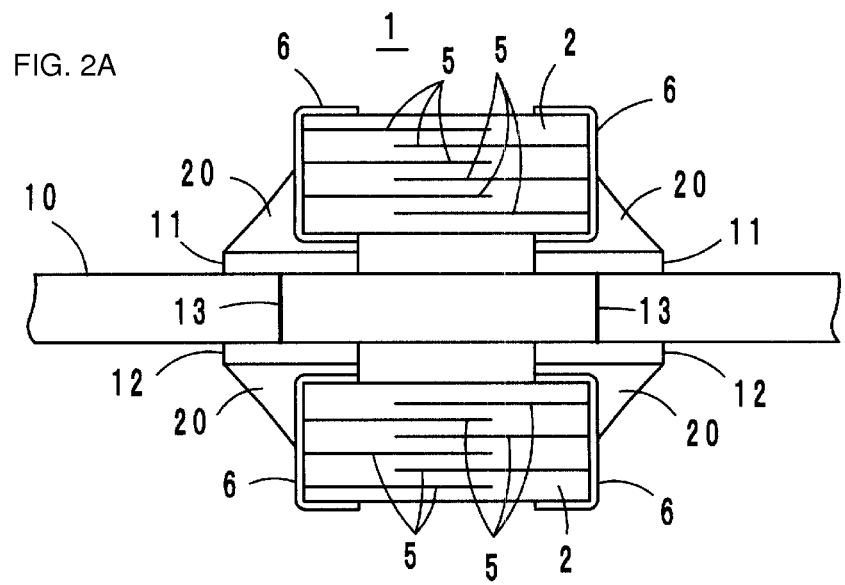
FIGS. 2A and 2B illustrate a state where the monolithic ceramic capacitors are mounted on a circuit board, and FIG. 2A and FIG. 2B, respectively are a cross-sectional view of a first mounting example and a cross-sectional view of a second mounting example.
Figure 2B:
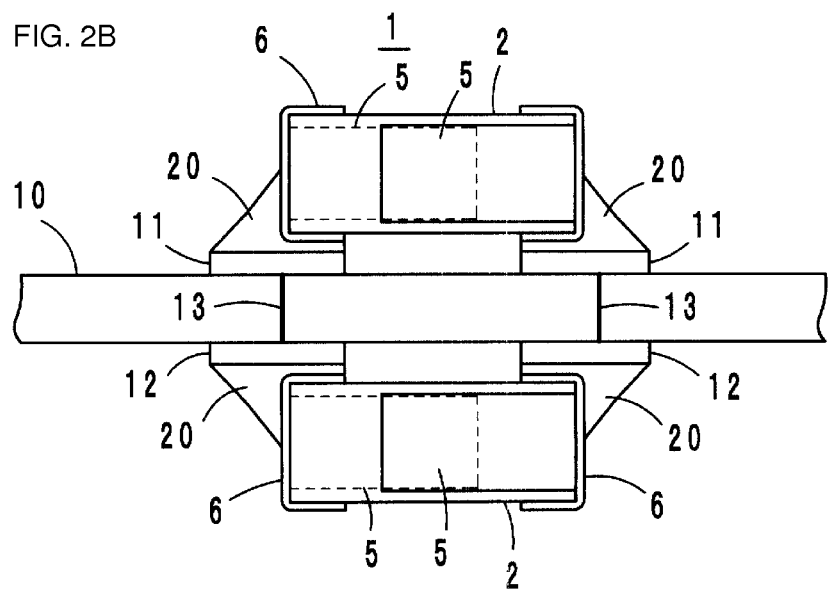

As illustrated in FIGS. 2A and 2B, lands 11 and lands 12, respectively, are formed at positions on the front surface and at positions on the rear surface of a circuit board 10 on which the monolithic ceramic capacitors 1 are to be mounted, each of the positions on the front surface being plane-symmetrical to a corresponding one of the positions on the rear surface. Each of the lands 11 and the corresponding lands 12, which are arranged to be plane-symmetrical to each other, are electrically connected to each other by a through hole conductor 13 extending through the front and rear surfaces of the circuit board 10. Various metal conductors such as conductive patterns and jumper wires can be used for electrical connection of the lands 11 and the corresponding lands 12 other than the through hole conductors 13.

The length, width, and height of each of the monolithic ceramic capacitors 1 including the outer electrodes 6 are L, W, H, respectively. The width W and the height H of each of the monolithic ceramic capacitors 1 preferably are the same or substantially the same (e.g., the difference preferably is about 10% or less). However, the width W and the height H need not be the same as each other and may be different from each other. The monolithic ceramic capacitors 1 are mounted on the circuit board 10 by electrically and mechanically connecting the outer electrodes 6 to the lands 11 and the lands 12 with a conductive joining material 20 such as solder. In this case, there is a case where the monolithic ceramic capacitors 1 are mounted on the circuit board 10 such that the planes of the inner electrodes 5 of the monolithic ceramic capacitors 1 are oriented in a parallel or substantially parallel direction with respect to the front and rear surfaces of the circuit board 10 as illustrated in FIG. 2A, and there is a case where the monolithic ceramic capacitors 1 are mounted on the circuit board 10 such that the planes of the inner electrodes 5 of the monolithic ceramic capacitors 1 are oriented in a perpendicular or substantially perpendicular direction with respect to the front and rear surfaces of the circuit board 10 as illustrated in FIG. 2B. The terms "parallel direction" and "perpendicular direction" include the range of directional variation that occurs at the time of manufacturing the monolithic ceramic capacitors 1 and the range of directional variation that occurs at the time of mounting the monolithic ceramic capacitors 1. Note that, in FIGS. 2A and 2B, the hatching is omitted in order to simplify FIGS. 2A and 2B.

In addition, there may be a case where the monolithic ceramic capacitor 1 that is to be mounted on the front surface of the circuit board 10 is mounted such that the planes of the inner electrodes 5 of the monolithic ceramic capacitor 1 are oriented in the parallel or substantially parallel direction with respect to the front surface of the circuit board 10, and the monolithic ceramic capacitor 1 that is to be mounted on the rear surface of the circuit board 10 is mounted such that the planes of the inner electrodes 5 of the monolithic ceramic capacitor 1 are oriented in the perpendicular or substantially perpendicular direction with respect to the rear surface of the circuit board 10. However, in various preferred embodiments of the present invention, the monolithic ceramic capacitors 1 that are to be mounted on the front and rear surfaces of the circuit board 10 are mounted such that the planes of the inner electrodes 5 of both the monolithic ceramic capacitors 1 are oriented in the parallel or substantially parallel or perpendicular or substantially perpendicular direction with respect to the front and rear surfaces. In other words, in the monolithic ceramic capacitors 1 that are mounted on the front and rear surfaces of the circuit board 10, the planes of the inner electrodes 5 are oriented in the parallel or substantially parallel direction with respect to the front and rear surfaces as illustrated in FIG. 2A, or the planes of the inner electrodes 5 are oriented in the perpendicular or substantially perpendicular direction with respect to the front and rear surfaces as illustrated in FIG. 2B.

The inventors of the present invention mounted the monolithic ceramic capacitors 1 on the front and rear surfaces of the circuit board 10 and measured the peak sound pressure level of the circuit board 10 caused by electric field-induced strains of the monolithic ceramic capacitors 1 in the following mounting forms. The results will be described below.

In a mounting form (1), the monolithic ceramic capacitor 1 was disposed only on the front surface of the circuit board 10 such that the planes of the inner electrodes 5 were oriented in the parallel or substantially parallel direction with respect to the front surface. In a mounting form (2), the monolithic ceramic capacitor 1 was disposed only on the front surface of the circuit board 10 such that the planes of the inner electrodes 5 were oriented in the perpendicular or substantially perpendicular direction with respect to the front surface. In a mounting form (3), one of the monolithic ceramic capacitors 1 was disposed on the front surface of the circuit board 10 such that the planes of the inner electrodes 5 of the monolithic ceramic capacitor 1 were oriented in the parallel or substantially parallel direction with respect to the front surface, and the other one of the monolithic ceramic capacitors 1 was disposed on the rear surface of the circuit board 10 such that the planes of the inner electrodes 5 of the monolithic ceramic capacitor 1 were oriented in the perpendicular or substantially perpendicular direction with respect to the rear surface. In a mounting form (4), one of a pair of the monolithic ceramic capacitors 1 was disposed on the front surface of the circuit board 10, and the other one of the pair of the monolithic ceramic capacitors 1 was disposed on the rear surface of the circuit board 10 such that the planes of the inner electrodes 5 of both the monolithic ceramic capacitors 1 were oriented in the parallel or substantially parallel direction with respect to the front and rear surfaces. In a mounting form (5), one of a pair of the monolithic ceramic capacitors 1 was disposed on the front surface of the circuit board 10, and the other one of the pair of the monolithic ceramic capacitors 1 was disposed on the rear surface of the circuit board 10 such that the planes of the inner electrodes 5 of both the monolithic ceramic capacitors 1 were oriented in the perpendicular or substantially perpendicular direction with respect to the front and rear surfaces.

Regarding the size of each of the monolithic ceramic capacitors 1 that were used in the experiment, the length L, the width W, and the height H were, for example, about 1.0 mm, about 0.5 mm, and about 0.5 mm, respectively, and the capacitance of each of the monolithic ceramic capacitors 1 was about 1 µf, for example. Note that the size and the capacitance of each of the monolithic ceramic capacitors 1 may be different from those used in the experiment. A resin substrate whose dimensions are about 40 mm×about 40 mm and whose thickness is about 1.6 mm, for example, was used as the circuit board 10. Sn-3.0Ag-0.5Cu solder was used as a joining material. Sound pressure levels were measured by applying a voltage of about 3.15 V having a frequency of about 3.2 kHz and an alternating voltage of about 1.0 Vp-p to the monolithic ceramic capacitors 1, for example.

Figure 3:
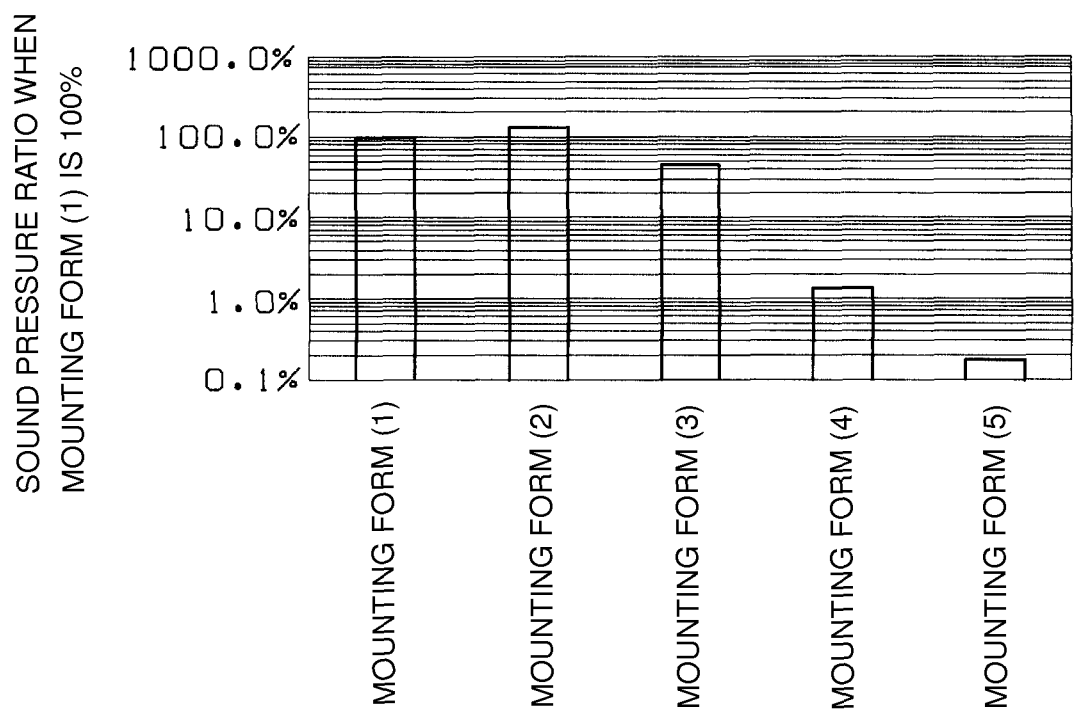
FIG. 3 is a graph illustrating vibration sound pressure levels in various mounting structures.

The peak sound pressure levels (relative ratio) in the mounting forms (1) to (5) are illustrated in FIG. 3. No improvement was observed in the mounting forms (1), (2) and (3). In the mounting form (4) in which one of a pair of the monolithic ceramic capacitors 1 was disposed on the front surface of the circuit board 10, and the other one of the pair of the monolithic ceramic capacitors 1 was disposed on the rear surface of the circuit board 10 such that the planes of the inner electrodes 5 of both the monolithic ceramic capacitors 1 were oriented in the parallel or substantially parallel direction with respect to the front and rear surfaces and in the mounting form (5) in which one of a pair of the monolithic ceramic capacitors 1 was disposed on the front surface of the circuit board 10, and the other one of the pair of the monolithic ceramic capacitors 1 was disposed on the rear surface of the circuit board 10 such that the planes of the inner electrodes 5 of both the monolithic ceramic capacitors 1 were oriented in the perpendicular or substantially perpendicular direction with respect to the front and rear surfaces, an improvement that was a reduction of about 30 dB or more from the mounting form (3) was observed. The most effective mounting form was the mounting form (5).

In other words, the outer electrodes 6 of the monolithic ceramic capacitors 1 were joined to the lands 11 and the lands 12, each of the lands 11 and the corresponding land 12 being formed at the positions on the front and rear surfaces of the circuit board 10 that were plane-symmetrical to each other, such that the surface directions of the planes of the inner electrodes 5 of the monolithic ceramic capacitors 1 matched one another, so that the states of vibrations that were transmitted from the monolithic ceramic capacitors 1, which have been joined to the front and rear surfaces of the circuit board 10, to the circuit board 10 were the same or substantially the same as each other. Thus, the vibrations transmitted to the circuit board 10 cancelled each other out. As a result, the vibration of the circuit board 10 was effectively reduced or prevented, and the vibration sound was significantly reduced or prevented.

Figure 4A:
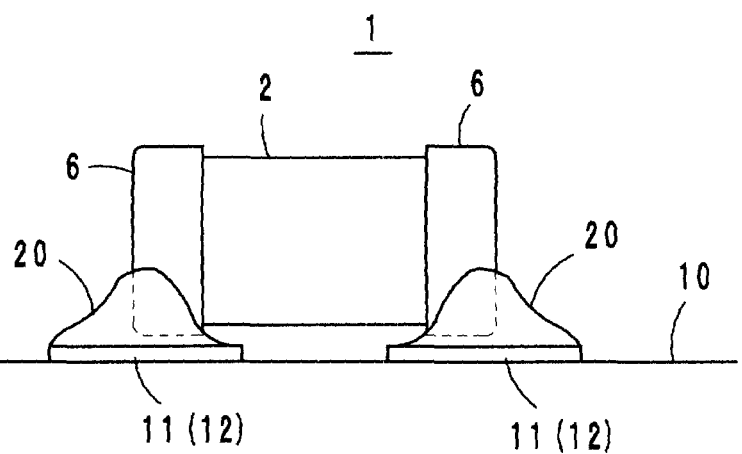
FIGS. 4A and 4B illustrate various formation states of fillets formed of a joining material, and FIG. 4A and FIG. 4B, respectively are an explanatory diagram illustrating the case where the amount of the joining material that forms the fillets is normal and an explanatory diagram illustrating the case where the amount of the joining material that forms the fillets is small.
Figure 4B:
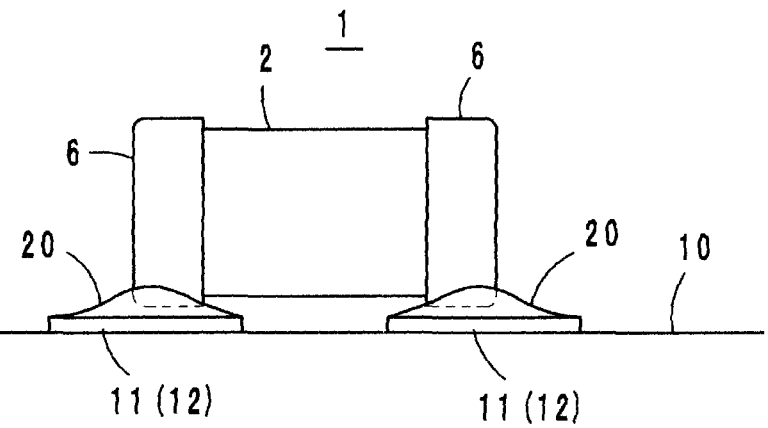

The amount (the heights of fillets) of the joining material 20 (solder) affects the vibration of the circuit board 10. FIG. 4A illustrates a formation state of the fillets having a normal height, and FIG. 4B illustrates a formation state of the fillets having a small height. Peak sound pressure levels were measured in the following mounting forms. In the mounting forms (1) to (5), the heights of the fillets were normal. In mounting forms (1a) to (5a), the heights of the fillets were small. In mounting forms (3b), (4b), and (5b), the heights of the fillets on the front surface side of the circuit board 10 were small, and the heights of the fillets on the rear surface side of the circuit board 10 were normal.

Figure 5:
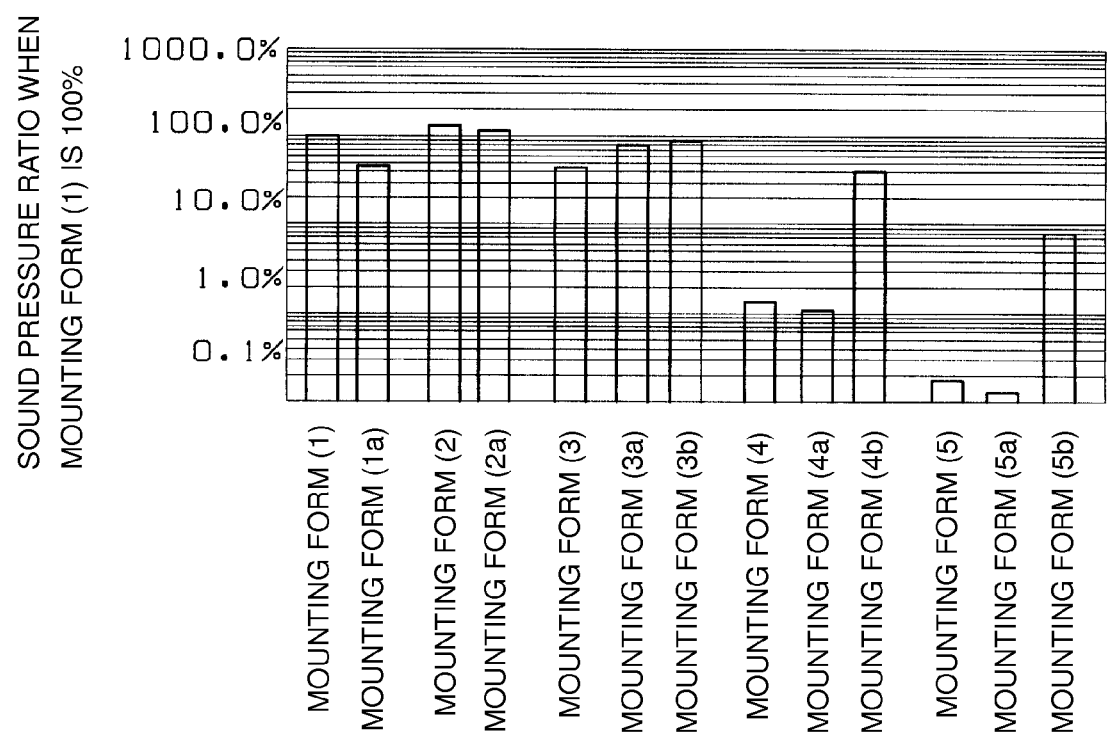
FIG. 5 is a graph illustrating vibration sound pressure levels in various mounting structures in which the formation states of the fillets formed of the joining material are varied.

As a result, as illustrated in FIG. 5, an improvement was observed in the mounting forms (4a) and (5a) compared with the mounting forms (1), (1a), (2), (2a), (3), (3a), (3b), (4), and (5). In addition, an improvement that was a reduction of the sound pressure level to a level that was one-quarter or less of the mounting form (4b) was observed in the mounting form (5b). Therefore, even if variation occurs in the heights of the fillets, vibration sound can be effectively reduced or prevented with more certainty by disposing the monolithic ceramic capacitors 1 such that the planes of the inner electrodes 5 of the monolithic ceramic capacitors 1 are oriented in the perpendicular or substantially perpendicular direction with respect to the front and rear surfaces of the circuit board 10. It is estimated that the sound pressure level becomes relatively small as the heights of the fillets are smaller because a deformation (vibration) transmission force of the joining material 20 is weak.

Figure 1B:
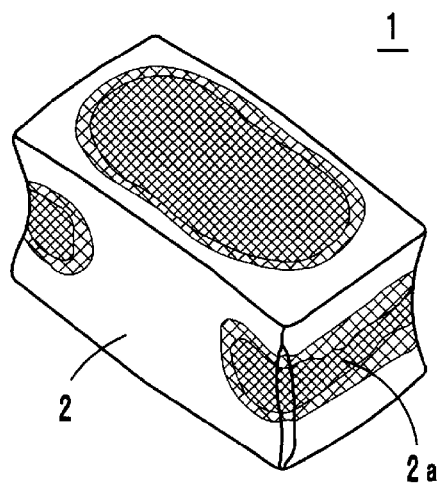

Here, the electric field-induced strain of the monolithic ceramic capacitor 1 will be described with reference to FIG. 1B. FIG. 1B schematically illustrates the deformation of the monolithic ceramic capacitor 1 in the case where the monolithic ceramic capacitor 1 is disposed such that the inner electrodes 5 are oriented in the parallel or substantially parallel direction with respect to a mounting surface. Deformation that occurs in a region illustrated by the coarse hatching is relatively small, and deformation that occurs in a region illustrated by the fine hatching is relatively large. Although the actual gradation of the deformation is finer, the deformation is schematically illustrated as two regions for ease of understanding.

A belt-shaped region 2a in which a large deformation occurs is present on the end surfaces of the multilayer body 2. In the case where the joining material 20 is joined to the region 2a, deformation (vibration) is easily transferred to the circuit board 10. In the case where the monolithic ceramic capacitors 1 are disposed such that the planes of the inner electrodes 5 of the monolithic ceramic capacitors 1 are oriented in the parallel or substantially parallel direction with respect to the front and rear surfaces of the circuit board 10, the belt-shaped region 2a of each of the monolithic ceramic capacitors 1 is oriented in the parallel or substantially parallel direction with respect to the circuit board 10. In the case where the joining material 20 is not in contact with the region 2a, deformation that is to be transferred to the circuit board 10 is small (see the mounting form (4a)). As in the mounting forms (4b) and (5b), when the heights of the fillets on the front surface of the circuit board 10 and the heights of the fillets on the rear surface of the circuit board 10 are different from each other, the degrees of the vibrations transmitted to the front and rear surfaces of the circuit board 10 are different from each other. Thus, the degree of vibration that is to be cancelled is likely to become small, and the sound pressure level of vibration sound is likely to become large.

In the case where the monolithic ceramic capacitors 1 are disposed such that the planes of the inner electrodes 5 of the monolithic ceramic capacitors 1 are oriented in the perpendicular or substantially perpendicular direction with respect to the front and rear surfaces of the circuit board 10, the belt-shaped region 2a of each of the monolithic ceramic capacitors 1 is oriented in the perpendicular or substantially perpendicular direction with respect to the circuit board 10. In this case, the most preferred measurement results of the improvement of sound pressure level were obtained.

When the height of each of the fillets is normal, it means that the height of each of the fillets is about 60% of the height H of the monolithic ceramic capacitor 1, for example. When the height of each of the fillets is small, it means that the height of each of the fillets is about 20% of the height H of the monolithic ceramic capacitor 1, for example. In other words, in the case where the monolithic ceramic capacitors 1 are disposed on the front and rear surfaces of the circuit board 10 such that the planes of the inner electrodes 5 of both the monolithic ceramic capacitors 1 are oriented in the parallel or substantially parallel direction or the perpendicular or substantially perpendicular direction with respect to the front and rear surfaces of the circuit board 10, vibration sound can be reduced or prevented even if the heights of the fillets formed of the joining material 20 that are to be formed on the monolithic ceramic capacitors 1 are different from one another. It is preferable that the differences between the heights of the fillets formed of the joining material 20 that are to be formed on the monolithic ceramic capacitors 1 be about 40% or less of the height H of the monolithic ceramic capacitor 1, for example.

An example of a method of mounting the monolithic ceramic capacitors 1 will now be described. Solder is used as the joining material 20, and mounting of the monolithic ceramic capacitors 1 is performed using a reflow oven. Note that a flow mounting method in which the monolithic ceramic capacitors 1 that are temporarily fixed on the circuit board 10 with an adhesive or the like is dipped into molten solder may be used. Alternatively, a conductive adhesive may be used as the joining material 20.

Figure 6:
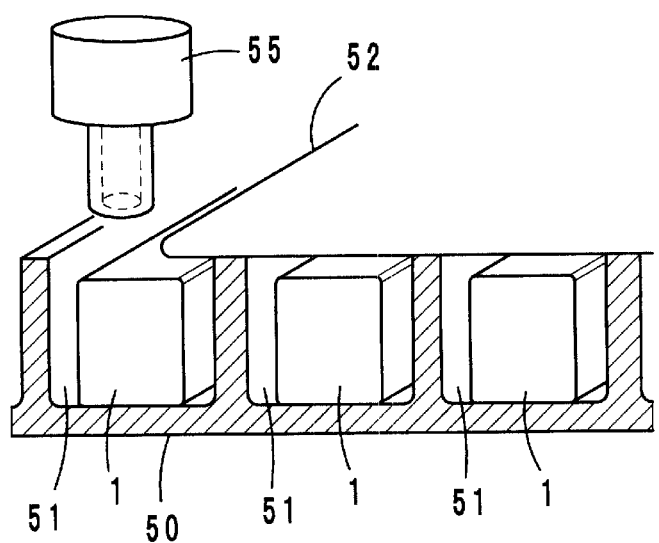
FIG. 6 is an explanatory diagram illustrating a portion of a process of mounting the monolithic ceramic capacitors.

More specifically, as illustrated in FIG. 6, while a cover tape 52 is being peeled off from a package 50 that includes a plurality of accommodating sections 51 in which the monolithic ceramic capacitors 1 are aligned and accommodated such that the inner electrodes 5 of the monolithic ceramic capacitors 1 are oriented in a certain direction, the monolithic ceramic capacitors 1 are subjected to suction and held one by one by a suction nozzle 55, and each of the monolithic ceramic capacitors 1 are mounted at a predetermined position on the front surface of the circuit board 10. A solder paste is printed on the lands 11 in advance. Next, the circuit board 10 on which the monolithic ceramic capacitors 1 have been mounted is made to pass through a reflow oven having a maximum temperature of about 250° C., so that the solder paste melts and solidifies, and the monolithic ceramic capacitors 1 are fixed onto the lands 11 of the circuit board 10.

The monolithic ceramic capacitors 1 are fixed onto the rear surface (the lands 12) of the circuit board 10 through a process the same as that described above.

In the case where the monolithic ceramic capacitors 1 are mounted on a plurality of the circuit board 10 each having the same configuration using the package 50 in which the monolithic ceramic capacitors 1 are aligned and accommodated such that the inner electrodes 5 of the monolithic ceramic capacitors 1 are oriented in a certain direction, in each of the circuit boards 10, the monolithic ceramic capacitors 1 are mounted such that the inner electrodes 5 of the monolithic ceramic capacitors 1 are oriented in the perpendicular or substantially perpendicular or the parallel or substantially parallel direction with respect to the front and rear surfaces of the circuit boards 10. Therefore, variations in the vibration sounds of the circuit boards 10 are small, and the vibration sounds of the circuit boards 10 can be consistently reduced or prevented. For example, when cross-sectional views of five circuit boards 10 each having the same configuration are observed, in all the five circuit boards, the inner electrodes 5 of all the monolithic ceramic capacitors 1 are oriented in the perpendicular or substantially perpendicular or the parallel or substantially parallel direction with respect to the front and rear surfaces of the circuit boards 10.

Other than a method of mounting the monolithic ceramic capacitors 1 using, as in the first preferred embodiment, the package 50 in which the monolithic ceramic capacitors 1 are aligned and accommodated such that the inner electrodes 5 are oriented in a certain direction, it is possible to mount the monolithic ceramic capacitors 1 on the front and rear surfaces of the circuit board 10 such that the inner electrodes 5 of both the monolithic ceramic capacitors 1 are oriented in a certain direction by using a method of identifying the monolithic ceramic capacitors 1 from the external shapes and other shapes of the monolithic ceramic capacitors 1 before mounting the monolithic ceramic capacitors 1 on the circuit board 10, a method of identifying the monolithic ceramic capacitors 1 by providing a mark indicating a directional property on a surface of each of the monolithic ceramic capacitors 1 in advance, a method of aligning the monolithic ceramic capacitors 1 using a magnetic force by utilizing the inner electrodes 5 of the monolithic ceramic capacitors 1, or the like.

The circuit board 10 may include a plurality of pairs of the monolithic ceramic capacitors 1 joined to the front and rear surfaces thereof. In this case, the inner electrodes 5 of all the monolithic ceramic capacitors 1 are oriented in the perpendicular or substantially perpendicular or the parallel or substantially parallel direction with respect to the front and rear surfaces of the circuit board 10. Consequently, as described above, the vibration sound is significantly reduced or prevented. By using the package 50 in which the monolithic ceramic capacitors 1 are aligned and accommodated such that the inner electrodes 5 of the monolithic ceramic capacitors 1 are oriented in a certain direction, the inner electrodes 5 of all the monolithic ceramic capacitors 1 can be easily oriented in the perpendicular or substantially perpendicular or the parallel or substantially parallel direction with respect to the front and rear surfaces of the circuit board 10.

Other preferred embodiments of the mounting structure and mounting method that have been described as the first preferred embodiment will be summarized.

Even if the amounts of electric field-induced strains of monolithic ceramic capacitors that are to be mounted on the front and rear surfaces of a circuit board are different from each other, the effect of reducing vibration sound can be obtained. However, the effect of cancelling vibration is larger when the amounts of electric field-induced strains of monolithic ceramic capacitors are the same or substantially the same as each other. In other words, it is preferable that each of the monolithic ceramic capacitors have the same configuration. Monolithic ceramic capacitors that are to be mounted on the front and rear surfaces of a circuit board need not have the same shape and size. Since vibration is to be transferred to a circuit board via lands, the difference between the dimensions of monolithic ceramic capacitors is acceptable as long as the monolithic ceramic capacitors can be mounted on the lands that are formed on the front and rear surfaces of the circuit board, each of the lands formed on the front surface being plane-symmetrical to a corresponding one of the lands formed on the rear surface.

Voltages that are the same or substantially the same as each other may be applied to monolithic ceramic capacitors that are to be mounted on the front and rear surfaces of a circuit board. Therefore, lands formed on the front and rear surfaces of a circuit board may be electrically connected to each other, and the arrangement and elements that electrically connect the lands together is arbitrary. It is preferable that the difference between voltages applied to monolithic ceramic capacitors that are to be mounted on the front and rear surfaces of a circuit board be about 20% or less in terms of voltage and about 20% or less in terms of phase shift, for example.

It is difficult, in the present circumstances, to mount monolithic ceramic capacitors that are to be mounted on the front and rear surfaces of a circuit board such that the monolithic ceramic capacitors are completely plane-symmetrical to each other. In the range in which the effect of reducing vibration sound can be obtained, it is preferable that the amounts of misregistrations of monolithic ceramic capacitors in a width direction and in a length direction be about 30% or less, and it is preferable that the angle formed by the central axes of two monolithic ceramic capacitors in the length direction be about 40° or less when viewed in plan, for example. In order to prevent deviations of positions and angles of monolithic ceramic capacitors, it is preferable to set the widths of lands to be about 0.8 to about 1.0 times the width W of each of the monolithic ceramic capacitors, for example.

As described above, preferred embodiments of the present invention are useful in a method of manufacturing a mounting substrate on which monolithic ceramic capacitors are mounted and a mounting structure, and in particular, the present invention has an advantage of effectively reducing or preventing the vibration sound of a circuit board.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A method of manufacturing a mounting substrate in which a pair of monolithic ceramic capacitors each of which includes a multilayer body in which a plurality of dielectric ceramic sheets and a plurality of planar or substantially planar inner electrodes are stacked on top of one another and at least a pair of outer electrodes that are electrically connected to the inner electrodes and that are provided on a surface of the multilayer body are mounted on a circuit board, the method of manufacturing a mounting substrate comprising:
   a step of joining the outer electrodes to lands that are formed on a front surface and a rear surface of the circuit board such that surface directions of planes of the inner electrodes match each other, the lands formed on the front surface being formed at positions that are plane-symmetrical to positions of the corresponding lands formed on the rear surface while being electrically connected to the corresponding lands formed on the rear surface; wherein
   the pair of monolithic ceramic capacitors are mounted such that the planes of the inner electrodes are oriented in a perpendicular or substantially perpendicular direction with respect to the front surface and the rear surface of the circuit board.

2. The method of manufacturing a mounting substrate according to claim 1, further comprising:
   a step of transporting the monolithic ceramic capacitors by accommodating the monolithic ceramic capacitors in a package; wherein
   the monolithic ceramic capacitors are accommodated in a plurality of accommodating sections of the package in a state of being aligned in a certain direction.

3. The method of manufacturing a mounting substrate according to claim 1, further comprising:
   a step of transporting the monolithic ceramic capacitors by accommodating the monolithic ceramic capacitors in a package; wherein
   the monolithic ceramic capacitors are accommodated in a plurality of accommodating sections of the package in a state of being aligned such that the planes of the inner electrodes are perpendicular or substantially perpendicular to bottom surfaces of the accommodating sections.

4. The method of manufacturing a mounting substrate according to claim 1, wherein the pair of monolithic ceramic capacitors are mounted on each of a plurality of the circuit boards such that the surface directions of the planes of the inner electrodes of each of the monolithic ceramic capacitors match each other.

5. The method of manufacturing a mounting substrate according to claim 1, wherein a plurality of the pairs of monolithic ceramic capacitors are mounted on the circuit board such that the surface directions of the planes of the inner electrodes of each of the plurality of pairs of the monolithic ceramic capacitors match each other.

6. The method of manufacturing a mounting substrate according to claim 5, wherein a configuration of each of the plurality of the pairs of monolithic ceramic capacitors is the same.

7. The method of manufacturing a mounting substrate according to claim 1, wherein a configuration of each of the pair of monolithic ceramic capacitors is the same.

8. The method of manufacturing a mounting substrate according to claim 1, wherein widths of the lands are about 0.8 to about 1.0 times a width of each of the monolithic ceramic capacitors.

9. The method of manufacturing a mounting substrate according to claim 1, wherein the step of step of joining the outer electrodes to lands includes forming joining material on the lands to join the outer electrodes to the lands such that a difference between a height of the joining material and a height of a respective one of the monolithic ceramic capacitors is about 40%.

10. A mounting structure in which a pair of monolithic ceramic capacitors each of which includes a multilayer body in which a plurality of dielectric ceramic sheets and a plurality of planar or substantially planar inner electrodes are stacked on top of one another and at least a pair of outer electrodes that are electrically connected to the inner electrodes and that are provided on a surface of the multilayer body are mounted on a circuit board; wherein
the circuit board includes lands on a front surface and a rear surface of the circuit board, the lands on the front surface being arranged at positions that are plane-symmetrical to positions of the corresponding lands on the rear surface and being electrically connected to the corresponding lands formed on the rear surface;
the outer electrodes of the monolithic ceramic capacitors are joined to the lands, which are located on the front surface and the rear surface of the circuit board, such that surface directions of planes of the inner electrodes match each other; and
the pair of monolithic ceramic capacitors are mounted such that the planes of the inner electrodes are oriented in a perpendicular or substantially perpendicular direction with respect to the front surface and the rear surface of the circuit board.

11. The mounting structure according to claim 10, further comprising a metal conductor, wherein the lands, which are located on the front surface of the circuit board, are electrically connected by the metal conductor to the corresponding lands located on the rear surface of the circuit board.

12. The mounting structure according to claim 10, wherein the pair of monolithic ceramic capacitors are mounted on each of a plurality of the circuit boards such that the surface directions of the planes of the inner electrodes of each of the monolithic ceramic capacitors match each other.

13. The mounting structure according to of claim 10, wherein a plurality of the pairs of monolithic ceramic capacitors are mounted on the circuit board such that the surface directions of the planes of the inner electrodes of each pair of the monolithic ceramic capacitors match each other.

14. The mounting structure according to claim 13, wherein a configuration of each of the plurality of the pairs of monolithic ceramic capacitors is the same.

15. The mounting structure according to claim 10, wherein a configuration of each of the pair of monolithic ceramic capacitors is the same.

16. The mounting structure according to claim 10, wherein widths of the lands are about 0.8 to about 1.0 times a width of each of the monolithic ceramic capacitors.

17. The mounting structure according to claim 10, further comprising joining material arranged on the lands to join the outer electrodes to the lands such that a difference between a height of the joining material and a height of a respective one of the monolithic ceramic capacitors is about 40%.

* * * * *